US010916376B2

(12) United States Patent
Byun et al.

(10) Patent No.: US 10,916,376 B2
(45) Date of Patent: Feb. 9, 2021

(54) ELECTRONIC COMPONENT

(71) Applicant: SAMSUNG ELECTRO-MECHANICS CO., LTD., Suwon-si (KR)

(72) Inventors: Man Su Byun, Suwon-si (KR); Ho Yoon Kim, Suwon-si (KR); Sang Soo Park, Suwon-si (KR); Woo Chul Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/200,402

(22) Filed: Nov. 26, 2018

(65) Prior Publication Data

US 2020/0118743 A1     Apr. 16, 2020

(30) Foreign Application Priority Data

Oct. 11, 2018 (KR) .................. 10-2018-0120864

(51) Int. Cl.
*H01G 2/06* (2006.01)
*H01G 4/005* (2006.01)
(Continued)

(52) U.S. Cl.
CPC ............ *H01G 2/065* (2013.01); *H01G 4/005* (2013.01); *H01G 4/12* (2013.01); *H01G 4/30* (2013.01); *H01L 28/40* (2013.01)

(58) Field of Classification Search
CPC .......... H01G 2/065; H01G 2/06; H01G 4/002; H01G 4/005; H01G 4/018; H01G 4/12;
(Continued)

(56) References Cited

U.S. PATENT DOCUMENTS

2006/0216594 A1   9/2006  You et al.
2009/0169726 A1*  7/2009  Fujii .................. B23K 1/19
                                            427/77
(Continued)

FOREIGN PATENT DOCUMENTS

JP    2012-204572 A    10/2012
JP    2013-236045 A    11/2013
(Continued)

OTHER PUBLICATIONS

Korean Office Action dated Sep. 20, 2019 issued in Korean Patent Application No. 10-2018-0120864 (with English translation).

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

An electronic component includes a multilayer capacitor including a capacitor body and an external electrode disposed at an end of the capacitor body, and an interposer including an interposer body and an external terminal disposed at an end of the interposer body. The external terminal includes a bonding portion disposed on a first surface of the interposer body and connected to the external electrode, a mounting portion disposed on a second surface of the interposer body opposing the first surface, and a connection portion disposed on an end surface of the interposer body to connect the bonding portion and the mounting portion and having an uneven surface, and a conductive bonding agent is disposed between the external electrode and the bonding portion of the external terminals, and an adhesive extends to a portion of the uneven surface.

11 Claims, 6 Drawing Sheets

(51) Int. Cl.
*H01G 4/12* (2006.01)
*H01G 4/30* (2006.01)
*H01L 49/02* (2006.01)

(58) Field of Classification Search
CPC ........ H01G 4/228; H01G 4/30; H01G 4/1227;
H01G 4/232; H01L 28/40; H01L 49/02;
H05K 3/3442; H05K 3/403; H05K
2201/049; H05K 2201/09181; H05K
2201/10015; H05K 2201/2045; Y02P
70/50
USPC ................. 361/301.4, 321.5, 321.4; 174/260
See application file for complete search history.

(56) References Cited

U.S. PATENT DOCUMENTS

| | | |
|---|---|---|
| 2013/0037911 A1 | 2/2013 | Hattori et al. |
| 2013/0294010 A1 | 11/2013 | Lee et al. |
| 2014/0016242 A1 | 1/2014 | Hattori et al. |
| 2014/0284089 A1* | 9/2014 | Hattori .................. H01G 4/232 174/258 |
| 2015/0206661 A1* | 7/2015 | Fujimura ............... H01G 4/228 361/301.4 |
| 2015/0270065 A1* | 9/2015 | Hattori .................. H01G 2/065 174/255 |
| 2016/0088733 A1* | 3/2016 | Lee ........................ H05K 1/144 361/768 |
| 2017/0105283 A1 | 4/2017 | Kim et al. |
| 2018/0175113 A1* | 6/2018 | Furuya .................. H01L 21/486 |

FOREIGN PATENT DOCUMENTS

| | | |
|---|---|---|
| JP | 5472230 B2 | 4/2014 |
| JP | 2015-185651 A | 10/2015 |
| KR | 10-2006-0085179 A | 7/2006 |
| KR | 10-2017-0042958 A | 4/2017 |

* cited by examiner

ELECTRONIC COMPONENT

CROSS-REFERENCE TO RELATED APPLICATION

This application claims the benefit of priority to Korean Patent Application No. 10-2018-0120864 filed on Oct. 11, 2018 in the Korean Intellectual Property Office, the disclosure of which is incorporated herein by reference in its entirety.

TECHNICAL FIELD

The present disclosure relates to an electronic component.

BACKGROUND

Multilayer capacitors, which may be miniaturized and realize high capacity, are used as components of various electronic devices.

Such a multilayer capacitor may include a plurality of dielectric layers and internal electrodes, having a structure in which the internal electrodes having opposite polarities are alternately disposed between the dielectric layers.

Here, the dielectric layers have piezoelectric properties, and thus, when a direct current (DC) or alternating current (AC) voltage is applied to the multilayer capacitor, a piezoelectric phenomenon may occur between the internal electrodes to make a capacitor body expand and contract in volume according to frequencies, causing periodic vibrations.

Such vibrations may be transferred to a board through solder connecting external electrodes of the multilayer capacitor and the board when the multilayer capacitor is mounted on the board, making the entirety of the board act as an acoustically reflective surface to generate vibratory sound as noise.

Vibratory sound may correspond to audio frequencies ranging from 20 Hz to 20,000 Hz, causing listener discomfort, and such vibratory sound, which may cause listener discomfort, is commonly known as acoustic noise.

In order to reduce acoustic noise, an electronic component using an interposer disposed between a multilayer capacitor and a board has been introduced.

However, in the case of an electronic component using a conventional interposer, a fixing strength is not ensured when the electronic component is mounted on a board, causing defective mounting.

Therefore, a technique for ensuring a fixing strength of a certain level or higher, while effectively reducing acoustic noise of a multilayer capacitor, is required.

SUMMARY

An aspect of the present disclosure may provide an electronic component in which a fixing strength with an interposer is ensured, while an acoustic noise reduction effect is reduced.

According to an aspect of the present disclosure, an electronic component may include: a multilayer capacitor including a capacitor body and an external electrode disposed at an end of the capacitor body; and an interposer including an interposer body and an external terminal disposed at an end of the interposer body. The external terminal includes a bonding portion disposed on a first surface of the interposer body and connected to the external electrode, a mounting portion disposed on a second surface of the interposer body opposing the first surface, and a connection portion disposed on an end surface of the interposer body to connect the bonding portion and the mounting portion and having an uneven surface, a conductive bonding agent is disposed between the external electrode and the bonding portion of the external terminal, and an adhesive layer formed as the conductive bonding agent is hardened extends to a portion of the uneven surface of the external terminal.

Roughness (Ra) of the uneven surface of the connection portion may be 0.5 μm or greater.

The interposer may be shorter in length and lower in thickness, as compared to the multilayer capacitor, and (L1×T1)/(L2×T2) may be less than 53 in which a length of the multilayer capacitor is L1, a distance between one end of the multilayer capacitor and one end of the interposer is L2, a thickness of the electronic component is T1, and a thickness from a lower end of the multilayer capacitor to a lower end of the interposer is T2.

A thickness of the connection portion of the external terminal may be smaller than thicknesses of the bonding portion and the mounting portion.

A modulus of the interposer may be 30 GPa or higher.

The interposer body may include alumina.

The capacitor body may include first and second surfaces opposing each other, third and fourth surfaces connected to the first and second surfaces and opposing each other, and fifth and sixth surfaces connected to the first and second surfaces, connected to the third and fourth surfaces, and opposing each other and include a plurality of dielectric layers and a plurality of first and second internal electrodes alternately disposed with the dielectric layer interposed therebetween, and one ends of the first and second internal electrodes may be exposed to the third and fourth surfaces, respectively.

The external electrode may include a head portion disposed on each of the third and fourth surfaces of the capacitor body and a band portion extending from the head portion to a portion of the first surface of the capacitor body.

The electronic component may further include a plating layer disposed on each of surfaces of the external electrodes and the external terminals.

According to another aspect of the present disclosure, an electronic component may include: a multilayer capacitor including a capacitor body and an external electrode disposed at an end of the capacitor body; and an interposer including an interposer body in which an end surface is an uneven surface and an external terminal disposed at an end of the interposer body. The external terminal includes a bonding portion disposed on a first surface of the interposer body and connected to the external electrode, a mounting portion disposed on a second surface of the interposer body opposing the first surface, and a via electrode penetrating through the interposer body to connect the bonding portion and the mounting portion, a conductive bonding agent is disposed between the external electrode and the bonding portion of the external terminal, and an adhesive layer formed as the conductive bonding agent is hardened extends to a portion of the uneven surface along the end surface of the interposer body.

The external terminals may have an end surface having a "⊏" shape.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described in detail with reference to the accompanying drawings.

Figure 1:
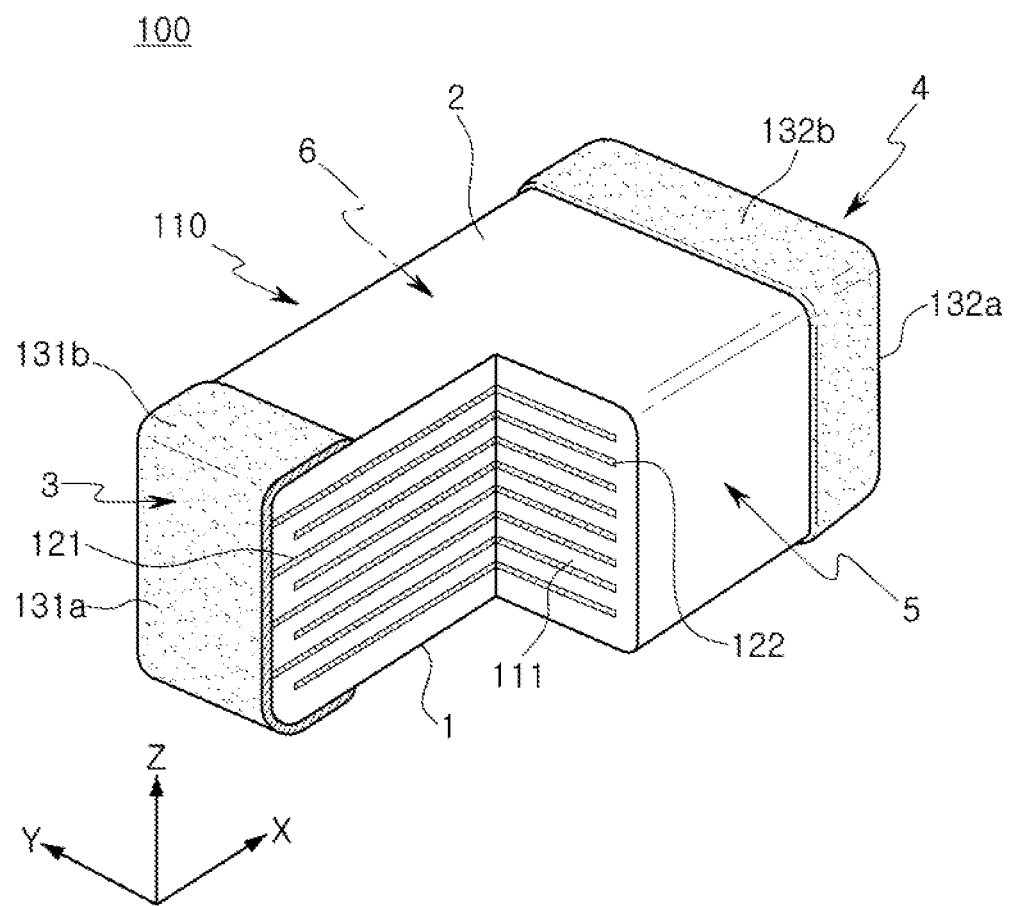
FIG. 1 is a partially cut perspective view of a multilayer capacitor applied to an electronic component in the present disclosure.
Figures 2A, 2B:
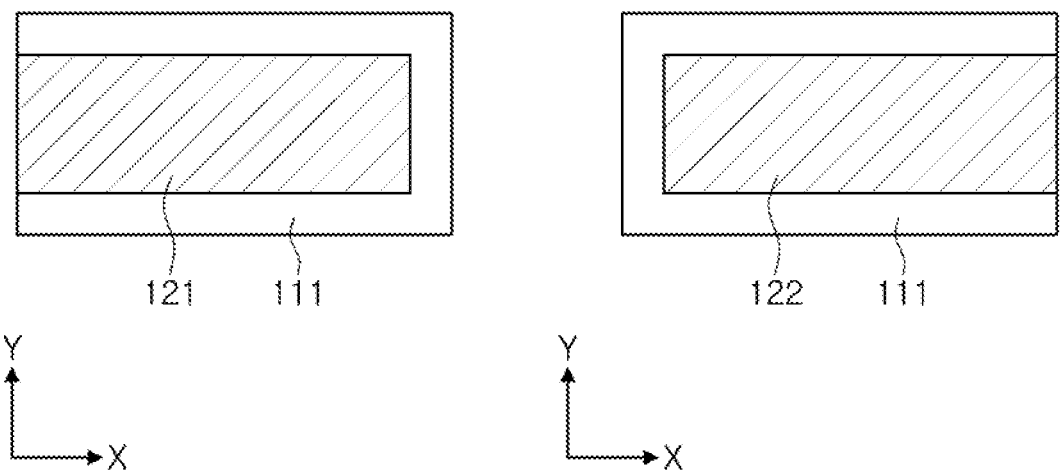
FIGS. 2A and 2B are plan views illustrating first and second internal electrodes of the multilayer capacitor of FIG. 1, respectively.

FIG. 1 is a partially cut perspective view of a multilayer capacitor applied to an electronic component of the present disclosure, and FIGS. 2A and 2B are plan views illustrating first and second internal electrodes of the multilayer capacitor of FIG. 1, respectively.

First, a structure of a multilayer capacitor applied to an electronic component of an exemplary embodiment will be described with reference to FIGS. 1 through 2B.

A multilayer capacitor 100 of the present exemplary embodiment includes a capacitor body 110 and first and second external electrodes 131 and 132 respectively disposed at both ends of the capacitor body 110 in the X direction.

The capacitor body 110 is formed by stacking a plurality of dielectric layers 111 in the Z direction and subsequently sintering the same. The adjacent dielectric layers 111 may be integrated such that boundaries therebetween may not be readily apparent without using a scanning electron microscope (SEM).

The capacitor body 110 includes a plurality of dielectric layers 111 and first and second internal electrodes 121 and 122 alternately disposed with the dielectric layer 111 interposed therebetween in the Z direction and having opposite polarities.

In addition, the capacitor body 110 may include an active region serving as a part contributing to capacity formation of the capacitor and cover regions provided on opposing side portions of the capacitor body 110 in the Y direction and on upper and lower surfaces of the active region in the Z direction, as marginal portions.

Although not limited in shape, the capacitor body 110 may have a hexahedral shape and include first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other.

The dielectric layer 111 may include a ceramic powder, for example, a $BaTiO_3$-based ceramic powder.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, in which Ca, Zr, and the like, is partially employed in $BaTiO_3$, but the present disclosure is not limited thereto.

In addition, a ceramic additive, an organic solvent, a plasticizer, a binder and a dispersant may further be added to the dielectric layer 111 together with the ceramic powder.

The ceramic additive may be, for example, a transition metal oxide or a transition metal carbide, a rare earth element, magnesium (Mg), aluminum (Al), and the like.

The first and second internal electrodes 121 and 122, which are applied with the opposite polarities, may be formed on the dielectric layer 111 and stacked in the Z direction. The first and second internal electrodes 121 and 122 may be alternately arranged with one dielectric layer 111 interposed therebetween in the Z direction inside the capacitor body 110.

Here, the first and second internal electrodes 121 and 122 may be electrically insulated from each other by the dielectric layer 111 disposed therebetween.

In the present disclosure, the structure in which the internal electrodes are stacked in the Z direction is described. However, the present disclosure is not limited thereto and may also be applied to a structure in which internal electrodes are stacked in the Y direction, as necessary.

The first and second internal electrodes 121 and 122 may be exposed to the third and fourth surfaces 3 and 4 of the capacitor body 110, respectively.

End portions of the first and second internal electrodes 121 and 122 alternately exposed to the third and fourth surfaces 3 and 4 of the capacitor body 110 may be electrically connected to the first and second external electrodes 131 and 132, respectively, disposed on both end portions of the capacitor body 110 (to be described hereinafter) in the X direction.

According to this configuration, when a predetermined voltage is applied to the first and second external electrodes 131 and 132, charges are accumulated between the first and second internal electrodes 121 and 122.

Here, capacitance of the multilayer capacitor 100 is proportional to an overlap area of the first and second internal electrodes 121 and 122 which overlap each other in the Z direction in the active region.

A material used to form the first and second internal electrodes 121 and 122 is not limited and the first and second internal electrodes 121 and 122 may be formed of a conductive paste including one or more materials among precious metals such as platinum (Pt), palladium (Pd), palladium-silver (Pd—Ag), and the like, and nickel (Ni) and copper (Cu).

Here, a screen printing method, a gravure printing method, or the like, may be used for printing the conductive paste but the present disclosure is not limited thereto.

The first and second external electrodes 131 and 132 may be provided with voltages having opposite polarities, disposed at opposing end portions of the capacitor body 110 in the X direction, and electrically connected to exposed end portions of the first and second internal electrodes 121 and 122, respectively.

The first external electrode 131 may include a first head portion 131a and a first band portion 131b.

The first head portion 131a is disposed on the third surface 3 of the capacitor body 110 and is in contact with an end portion of the first internal electrode 121 outwardly exposed to the third surface 3 of the capacitor body 110 to serve to electrically connect the first internal electrode 121 and the first external electrode 131.

The first band portion 131b extends from the first head portion 131a to portions of the first, second, fifth, and sixth surfaces 1, 2, 5, and 6 of the body 110 to enhance a fixing strength, or the like.

The second external electrode 132 may include a second head portion 132a and a second band portion 132b.

The second head portion 132a is disposed on the fourth surface 4 of the capacitor body 110 and is in contact with an end portion of the second internal electrode 122 outwardly exposed to the fourth surface 4 of the capacitor body 110 to serve to electrically connect the second internal electrode 122 and the second external electrode 132.

The second band portion 132b extends from the second head portion 132a to portions of the first, second, fifth, and sixth surfaces 1, 2, 5, and 6 of the body 110 to enhance a fixing strength, or the like.

Meanwhile, the first and second external electrodes 131 and 132 may further include a plating layer.

The plating layer may include first and second nickel (Ni) plating layers and first and second tin (Sn) plating layers respectively covering the first and second nickel plating layers.

Figure 3:
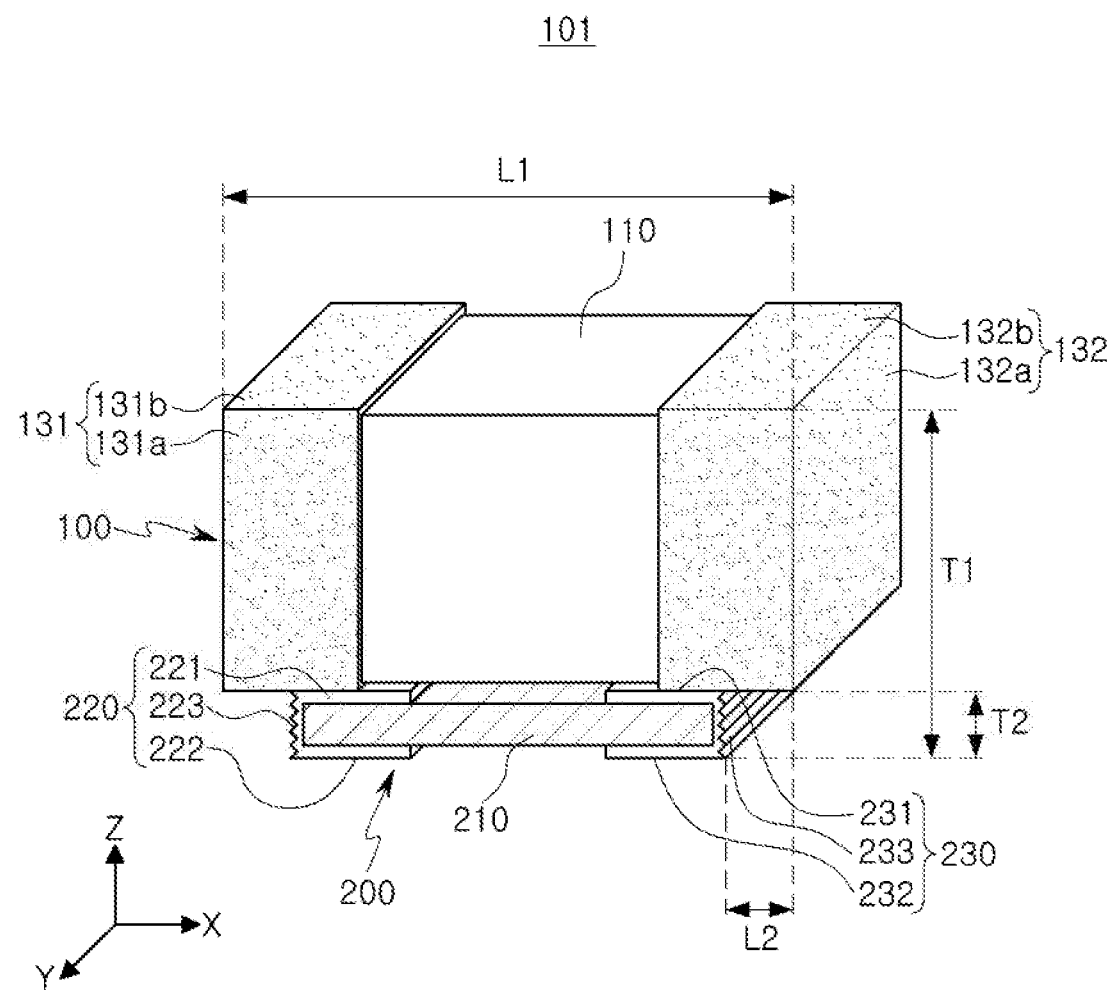
FIG. 3 is a perspective view of an electronic component according to an exemplary embodiment in the present disclosure.
Figure 4:
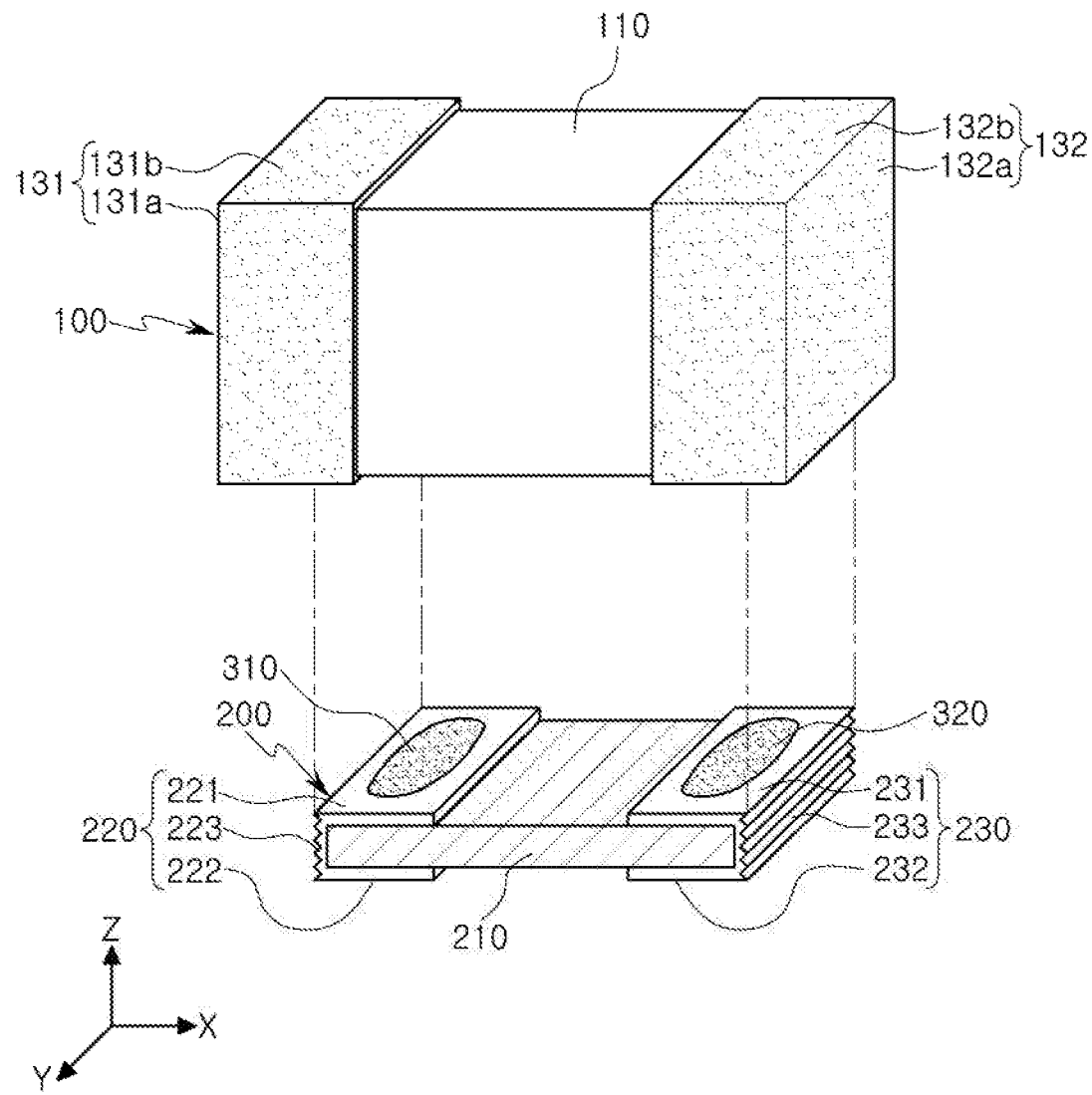
FIG. 4 is an exploded perspective view of the electronic component of FIG. 3.
Figure 5:
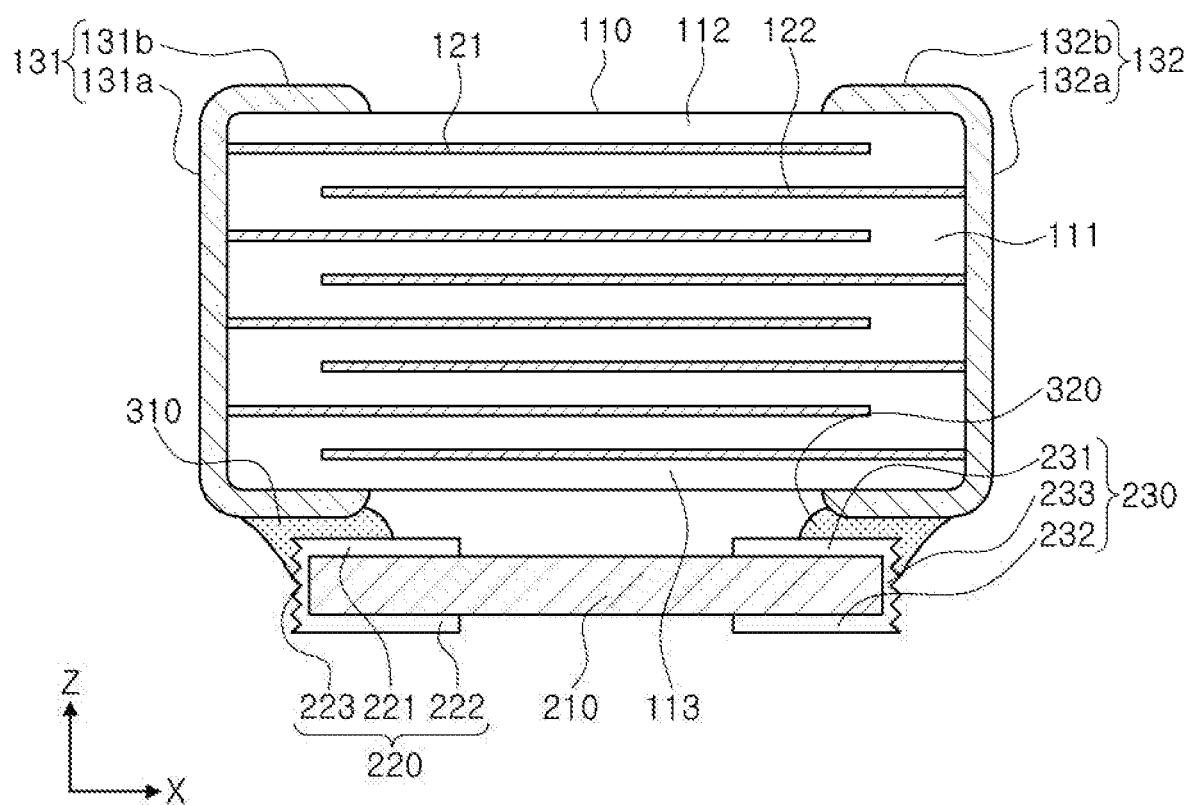
FIG. 5 is a cross-sectional view of the electronic component of FIG. 3.

FIG. 3 is a perspective view of an electronic component according to an exemplary embodiment in the present disclosure, FIG. 4 is an exploded perspective view of the electronic component of FIG. 3, and FIG. 5 is a cross-sectional view of the electronic component of FIG. 3.

Referring to FIGS. 3 through 5, an electronic component 101 according to the present exemplary embodiment includes a multilayer capacitor 100 and an interposer 200.

The interposer 200 includes an interposer body 210 and first and second external terminals 220 and 230 respectively formed at both end portions of the interposer body 210 in the X direction.

The interposer 200 may have high rigidity characteristics and have a modulus of 30 GPa or greater.

The interposer body 210 is formed of a ceramic material, and preferably, formed of alumina ($Al_2O_3$).

A length of the interposer body 210 in the X direction and a width of the interposer body 210 in the Y direction may be equal to or smaller than the length of the capacitor body 110 in the X direction and the width of the capacitor body 110 in the Y direction, respectively.

The first and second external terminals 220 and 230 may be provided with voltages of the opposite polarities and may be electrically connected to the first and second band portions 131b and 132b of the first and second external electrodes 131 and 132.

The first external terminal 220 includes a first bonding portion 221, a first mounting portion 222, and a first connection portion 223.

The first bonding portion 221 is formed on an upper surface of the interposer body 210, exposed at one end through one surface of the interposer body 210 in the X direction, and connected to the first band portion 131b of the first external electrode 131.

The first mounting portion 222 is formed on a lower surface of the interposer body 210 to oppose the first bonding portion 221 in the Z direction. The first mounting portion 222 may serve as a terminal, when mounted on a board.

The first connection portion 223 is formed on one end surface of the interposer body 210 in the X direction and serves to electrically and physically connect an end portion of the first bonding portion 221 and an end portion of the first mounting portion 222.

Here, a surface of the first connection portion 223 is an uneven surface including a plurality of depressions and protrusions.

Here, a conductive bonding agent 310 may be disposed between the first bonding portion 221 and the first band portion 131b to bond the first bonding portion 221 and the first band portion 131b.

The conductive bonding agent 310 may be formed of a high melting point solder, or the like.

When the conductive bonding agent 310 is cured, an adhesive layer is formed. The adhesive layer may be formed to extend from a portion between the first band portion 131b and the first bonding portion 221 to a portion of the uneven surface along the first connection portion 223.

The second external terminal 230 includes a second bonding portion 231, a second mounting portion 232, and a second connection portion 233.

The second bonding portion 231 is formed on an upper surface of the interposer body 210, exposed at one end through the other surface of the interposer body 210 in the X direction, and connected to the second band portion 132b of the second external electrode 132.

The second mounting portion 232 is formed on a lower surface of the interposer body 210 to oppose the second bonding portion 231 in the Z direction. The second mounting portion 232 may serve as a terminal, when mounted on a board.

The second connection portion 233 is formed on the other end surface of the interposer body 210 in the X direction and serves to electrically and physically connect an end portion of the second bonding portion 231 and an end portion of the second mounting portion 232.

Here, a surface of the second connection portion 233 is an uneven surface including a plurality of depressions and protrusions.

Here, a conductive bonding agent 320 may be disposed between the second bonding portion 231 and the second band portion 132b to bond the second bonding portion 231 and the second mounting portion 232.

The conductive bonding agent 320 may be formed of a high melting point solder, or the like.

When the conductive bonding agent 320 is cured, an adhesive layer is formed. The adhesive layer is formed to extend from a portion between the second band portion 132b and the second bonding portion 231 to a portion of the uneven surface along the second connection portion 233.

In an exemplary embodiment, a thickness of the first connection portion 223 may be smaller than a thickness of the first bonding portion 221 or the first mounting portion 222. Here, the thickness of the first connection portion 223 refers to a maximum thickness of the first connection portion 223 in the X direction.

A thickness of the second connection portion 233 may be smaller than a thickness of the second connection portion 231 or the second mounting portion 232. Here, the thickness of the second connection portion 233 refers to a maximum thickness of the second connection portion 233 in the X direction.

Figure 6:
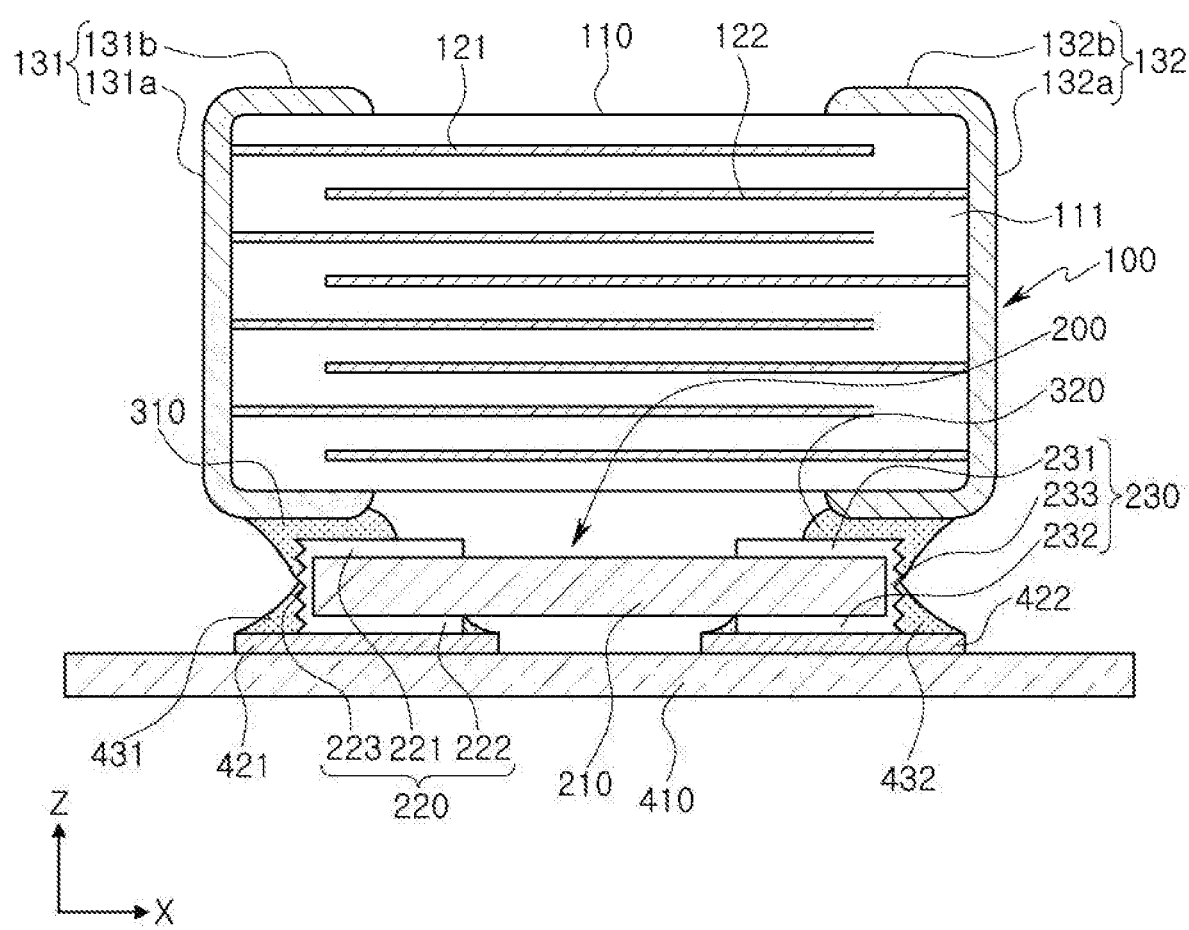
FIG. 6 is a cross-sectional view illustrating a state in which the electronic component of FIG. 3 is mounted on a board.

As illustrated in FIG. 6, when the thickness of the first and second connection portions 223 and 233 is smaller than that of the first and second connection portions 221 and 231 and the first and second mounting portions 222 and 232, opposing end portions of the interposer 200 in the X direction where the first and second connection portions 223 and 233 are formed may serve as a solder pocket and reduce a height of solders 431 and 432 formed to bond a board 410 and the interposer 200 at the time of mounting on the board 410 to further reduce acoustic noise of the multilayer capacitor 100.

In order to form the first and second connection portions 223 and 233 to have a thickness smaller than the thickness of the first and second bonding portions 221 and 231 and the thickness of the first and second mounting portions 222 and 232, the first and second connection portions 223 and 233 may be formed through sputtering and the first and second bonding portions 221 and 231 and the first and second mounting portions 222 and 232 may be formed through printing so as to be relatively thick.

In FIG. 6, reference numerals 421 and 422 denote first and second land patterns which the first and second mounting portions 222 and 232 of the first and second external terminals 220 and 230 are in contact with so as to be connected, respectively.

Roughness Ra of the uneven surfaces of the first and second connection portions 223 and 233 may be 0.5 μm or greater.

Table 1 below shows a relationship between roughness and a fixing strength of the uneven surface of the connection portion of the external terminal of the interposer. As illustrated in Table 1, it can be seen that, samples 1 to 4 in which roughness of the uneven surface of the connection portion is less than 0.5 μm have a fixing strength less than 30N but samples 5 to 9 in which roughness of the uneven surface of the connection portion is equal to or higher than 0.5 μm have a fixing strength equal to or higher than a minimum of 39.76N, which is significantly enhanced.

TABLE 1

| # | Roughness of uneven surface (Ra) | Fixing strength (N) |
|---|---|---|
| 1 | 0.1 | 27.06 |
| 2 | 0.2 | 28.02 |
| 3 | 0.3 | 27.62 |
| 4 | 0.4 | 28.83 |
| 5 | 0.5 | 41.82 |
| 6 | 0.7 | 39.76 |
| 7 | 0.9 | 45.11 |
| 8 | 1.1 | 51.74 |
| 9 | 1.7 | 48.02 |

Meanwhile, a plating layer may be further formed on the surfaces of the first and second external terminals 220 and 230 if necessary.

The plating layer may include a nickel plating layer and a tin plating layer covering the nickel plating layer.

When voltages having the opposite polarities are applied to the first and second external electrodes 131 and 132 formed on the electronic component 100 in a state in which the electronic component 100 is mounted on the board 410, the capacitor body 110 expands and contracts in the Z direction due to an inverse piezoelectric effect of the dielectric layer 111.

Then, the opposing end portions of the first and second external electrodes 131 and 132 contract and expand against the expansion and contraction of the capacitor body 110 in the Z direction, due to the Poisson effect. Such contraction and expansion cause vibration.

The vibration is transmitted to the board 410 through the first and second external electrodes 131 and 132 and the first and second external terminals 220 and 230, and thus, sound is radiated from the board to generate acoustic noise.

The interposer 200 according to the present exemplary embodiment is adhered to the first surface side in the mounting direction of the multilayer capacitor 100 to serve to prevent vibration from the multilayer capacitor 100 to the board 410, whereby acoustic noise of the multilayer capacitor 100 may be reduced.

Further, in the present exemplary embodiment, the multilayer capacitor 100 and the interposer 200 are coupled by a conductive bonding agent formed of a high melting point solder, or the like.

Here, the surface of the connection portion of the external terminal of the interposer 200 is formed as an uneven surface, and the conductive bonding agent is hardened in a state of being penetrated into the depressions of the uneven surface. Here, the protrusions of the uneven surface act as a rake to serve to firmly grip a bonding layer formed of the hardened conductive bonding agent, enhancing a fixing strength between the multilayer capacitor 100 and the interposer 200.

Meanwhile, the interposer of the present exemplary embodiment is shorter in length and lower in thickness, as compared to the multilayer capacitor.

Also, $(L1 \times T1)/(L2 \times T2)$ may be less than 53 in which a length of the multilayer capacitor is L1, a distance between one end of the multilayer capacitor and one end of the interposer is L2, a thickness of the electronic component is T1, and a thickness from a lower end of the multilayer capacitor to a lower end of the interposer is T2.

TABLE 2

| # | L1 (mm) | T1 (mm) | L1 × T1 | L2 (mm) | T2 (mm) | L2 × T2 | (L1 × T1)/(L2 × T2) | A.N. |
|---|---|---|---|---|---|---|---|---|
| 1 | 2.08 | 1.96 | 4.077 | 0.14 | 0.50 | 0.070 | 58.12 | 36.2 |
| 2 | 2.07 | 1.97 | 4.078 | 0.14 | 0.51 | 0.072 | 56.78 | 35.9 |
| 3 | 2.07 | 1.99 | 4.119 | 0.15 | 0.50 | 0.075 | 54.92 | 36 |
| 4 | 2.08 | 1.98 | 4.118 | 0.15 | 0.52 | 0.078 | 52.80 | 32.5 |
| 5 | 2.07 | 1.97 | 4.078 | 0.18 | 0.49 | 0.086 | 47.29 | 32.1 |
| 6 | 2.07 | 1.98 | 4.099 | 0.19 | 0.52 | 0.097 | 42.15 | 32.4 |
| 7 | 2.08 | 1.97 | 4.098 | 0.20 | 0.52 | 0.101 | 40.39 | 31.7 |
| 8 | 2.08 | 1.98 | 4.118 | 0.22 | 0.51 | 0.110 | 37.34 | 31.8 |
| 9 | 2.07 | 1.97 | 4.078 | 0.23 | 0.50 | 0.116 | 35.17 | 32 |
| 10 | 2.07 | 1.97 | 4.078 | 0.26 | 0.52 | 0.135 | 30.10 | 31.7 |

Referring to Table 2, it can be seen that a threshold of $(L1 \times T1)/(L2 \times T2)$ is 53 because acoustic noise is drastically reduced by about 2.5 dB from sample 4 in which $(L1 \times T1)/(L2 \times T2)$ is less than 53.

Meanwhile, it can be seen that, the sample 10 in which L2 is 0.26 mm may have a problem of contact between the board and the multilayer capacitor, and thus, a desirable lower limit value of $(L1 \times T1)/(L2 \times T2)$ is 30.

Figure 7:
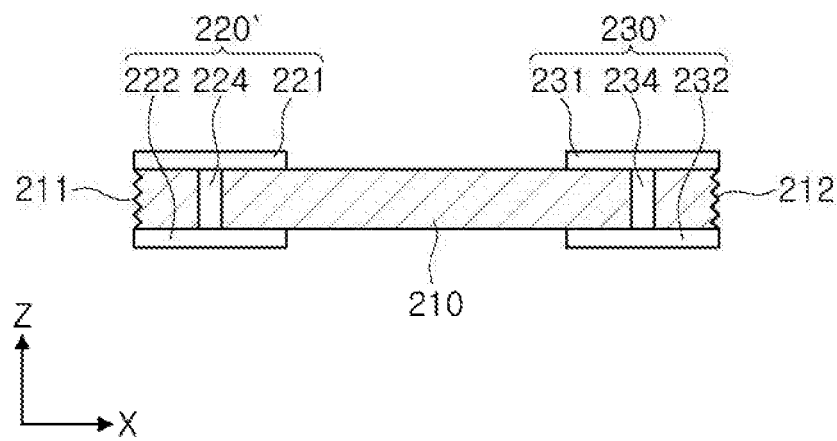
FIG. 7 is a cross-sectional view schematically illustrating an interposer according to another exemplary embodiment in the present disclosure.
Figure 8:
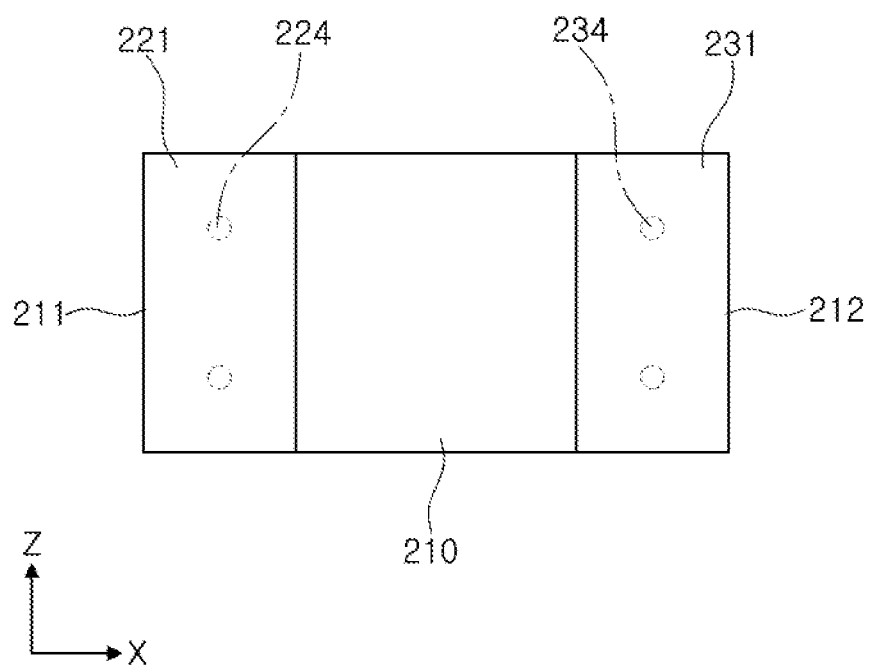
FIG. 8 is a plan view of the interposer of FIG. 7.

FIG. 7 is a cross-sectional view schematically illustrating an interposer according to another exemplary embodiment in the present disclosure, and FIG. 8 is a plan view of the interposer of FIG. 7.

Here, a structure of a body of a multilayer capacitor and bonding portions and mounting portions of an interposer is similar to the exemplary embodiment described above, and thus, a detailed description thereof will be omitted in order to avoid redundancy, and a via electrode of the interposer having a structure different from that of the exemplary embodiment described above will be illustrated and described in detail.

Referring to FIGS. 7 and 8, in the interposer of the present exemplary embodiment, a first external terminal 220' formed at one end portion of an interposer body 210 in the X direction may not have a connection portion and include a first via electrode 224 penetrating through the interposer body 210 in the Z direction, and the first via electrode 224 may electrically and physically connect a first bonding portion 221 and a first mounting portion 222.

A second external terminal 230' formed at the other end of the interposer body 210 in the X direction may not have a connection portion and include a second via electrode 234 penetrating through the interposer body 210 in the Z direction, and the second via electrode 234 may electrically and physically connect a second bonding portion 231 and a second mounting portion 232.

Here, opposing end surfaces of the interposer body 210 in the X direction may be formed as uneven surfaces 211 and 212, and an adhesive layer (not shown), which is formed as a conductive bonding agent disposed between the first and second band portions 131b and 132b of the first and second external electrodes 131 and 132 and first and second bonding portions 221 and 231 of the first and second external terminals 220' and 230' opposing each other is hardened, may extend to portions of the uneven surfaces 211 and 212 along the opposing end surfaces of the interposer body 210.

Here, roughness Ra of the opposing end surfaces of the interposer body 210 in the X direction may be 0.5 μm or greater.

When the external terminal is configured to include the via electrode without a connection portion, a length of the interposer in the X direction may be further reduced to increase a space acting as a solder pocket by the reduced length, and thus, acoustic noise may be further reduced.

According to this structure, the first external terminal 220' may be formed to have an X-Z cross-section having a shape of [and the second external terminal 230' may be formed to have an X-Z cross-section having a shape of].

As set forth above, according to exemplary embodiments in the present disclosure, a fixing strength of a predetermined level or higher may be ensured between the multilayer capacitor and the interposer when the multilayer capacitor is mounted on a board, while an acoustic noise reduction effect of the multilayer capacitor is maintained at a predetermined level or higher.

While exemplary embodiments have been illustrated and described above, it will be apparent to those skilled in the art that modifications and variations could be made without departing from the scope of the present disclosure as defined by the appended claims.

What is claimed is:

1. An electronic component comprising:
    a multilayer capacitor including a capacitor body and an external electrode disposed at an end of the capacitor body; and
    an interposer including an interposer body and an external terminal disposed at an end of the interposer body,
    wherein the external terminal includes a bonding portion disposed on a first surface of the interposer body and electrically connected to the external electrode, a mounting portion disposed on a second surface of the interposer body opposing the first surface, and a connection portion disposed on an end surface of the interposer body to connect the bonding portion and the mounting portion and having an uneven surface having higher surface roughness than at least one surface of the bonding or mounting portions, and
    a conductive bonding agent is disposed between the external electrode and the bonding portion of the external terminal, and an adhesive layer formed as the conductive bonding agent is hardened extends to a portion of the uneven surface of the connection portion.

2. The electronic component of claim 1, wherein roughness (Ra) of the uneven surface of the connection portion is 0.5 μm or greater.

3. The electronic component of claim 1, wherein the interposer is shorter in length and lower in thickness, as compared to the multilayer capacitor, and
    (L1×T1)/(L2×T2) is less than 53, where L1 is a length of the multilayer capacitor, L2 is a distance between one end of the multilayer capacitor and one end of the interposer, T1 is a thickness of the electronic component, and T2 is a thickness from a lower end of the multilayer capacitor to a lower end of the interposer.

4. An electronic component of claim 1, comprising:
    a multilayer capacitor including a capacitor body and an external electrode disposed at an end of the capacitor body; and
    an interposer including an interposer body and an external terminal disposed at an end of the interposer body,
    wherein the external terminal includes a bonding portion disposed on a first surface of the interposer body and electrically connected to the external electrode, a mounting portion disposed on a second surface of the interposer body opposing the first surface, and a connection portion disposed on an end surface of the interposer body to connect the bonding portion and the mounting portion and having an uneven surface,
    a conductive bonding agent is disposed between the external electrode and the bonding portion of the external terminal, and an adhesive layer formed as the conductive bonding agent is hardened extends to a portion of the uneven surface of the connection portion, and
    a thickness of the connection portion of the external terminal is smaller than thicknesses of the bonding portion and the mounting portion.

5. The electronic component of claim 1, wherein a modulus of the interposer is 30 GPa or higher.

6. The electronic component of claim 1, wherein the interposer body includes alumina.

7. The electronic component of claim 1, wherein the capacitor body includes first and second surfaces opposing each other, third and fourth surfaces connected to the first and second surfaces and opposing each other, and fifth and sixth surfaces connected to the first and second surfaces, connected to the third and fourth surfaces, and opposing each other and include a plurality of dielectric layers and a plurality of first and second internal electrodes alternately disposed with the dielectric layer interposed therebetween, and one ends of the first and second internal electrodes are exposed to the third and fourth surfaces, respectively.

8. The electronic component of claim 7, wherein the external electrodes each include a head portion disposed on each of the third and fourth surfaces of the capacitor body and a band portion extending from the head portion to a portion of the first surface of the capacitor body.

9. The electronic component of claim 1, further comprising a plating layer disposed on each of surfaces of the external electrodes and the external terminals.

10. The electronic component of claim 1, wherein the external electrode includes first and second external electrodes disposed on opposite end surfaces of the capacitor body, the external terminal includes first and second external terminals disposed on opposite ends of the interposer body, and the first and second external electrodes are electrically connected to the first and second external terminals, respectively.

11. The electronic component of claim 1, wherein a thickness of the connection portion is different from a thickness of at least one of the bonding portion or the mounting portion.

* * * * *